United States Patent
Sarwar et al.

(10) Patent No.: US 11,327,882 B2
(45) Date of Patent: May 10, 2022

(54) METHOD AND APPARATUS FOR ELIMINATING BIT DISTURBANCE ERRORS IN NON-VOLATILE MEMORY DEVICES

(71) Applicant: Allegro MicroSystems, LLC, Manchester, NH (US)

(72) Inventors: Muhammed Sarwar, North Grafton, MA (US); Vyankatesh Gupta, Manchester, NH (US); James McClay, Dudley, MA (US); Sundar Chetlur, Bedford, NH (US); Harianto Wong, Southborough, MA (US); Gerardo A. Monreal, Buenos Aires (AR); Nicolás Rafael Biberidis, Barcelona (ES); Octavio H. Alpago, Ciudad de Buenos Aires (AR); Nicolas Rigoni, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 218 days.

(21) Appl. No.: 16/782,139

(22) Filed: Feb. 5, 2020

(65) Prior Publication Data
US 2021/0240606 A1 Aug. 5, 2021

(51) Int. Cl.
*G06F 12/02* (2006.01)
*G06F 9/30* (2018.01)
*G11C 16/26* (2006.01)

(52) U.S. Cl.
CPC ...... *G06F 12/0238* (2013.01); *G06F 9/30029* (2013.01); *G06F 9/30043* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 7,573,112 B2 | 8/2009 | Taylor | |
| 7,633,115 B2 | 12/2009 | Wang | |
| 7,676,914 B2 | 3/2010 | Taylor | |
| 7,687,882 B2 | 3/2010 | Taylor et al. | |
| 7,715,219 B2 | 5/2010 | Monreal | |
| 8,093,670 B2 | 1/2012 | Taylor | |
| 8,370,714 B2 * | 2/2013 | DeBrosse | G06F 11/1048 714/766 |

(Continued)

OTHER PUBLICATIONS

Berkeley, EEGS 247 Lecture 21, 2007, pp. 33-35 (Year: 2007).*

(Continued)

*Primary Examiner* — James G Norman
(74) *Attorney, Agent, or Firm* — Daly, Crowley, Mofford & Durkee, LLP

(57) ABSTRACT

A method comprising: performing a first read from an address in a data storage module by using a first read voltage; storing, in a first register, data that is retrieved from the data storage module as a result of the first read; performing a second read from the address by using a second read voltage; storing, in a second register, data that is retrieved from the data storage module as a result of the second read; detecting whether a weak bit condition is present at the address based on the data that is stored in the first register and the data that is stored in the second register; and correcting the weak bit condition, when the weak bit condition is present at the address.

24 Claims, 10 Drawing Sheets

(56) References Cited

U.S. PATENT DOCUMENTS

| | | |
|---|---|---|
| 8,736,260 B2 | 5/2014 | Foletto et al. |
| 9,184,012 B2 | 11/2015 | Wang |
| 9,395,391 B2 | 7/2016 | Fernandez et al. |
| 9,476,899 B2 | 10/2016 | Fernandez et al. |
| 9,625,534 B2 | 4/2017 | Cadugan et al. |
| 9,644,999 B2 | 5/2017 | Foletto et al. |
| 10,026,478 B1 | 7/2018 | Choi et al. |
| 10,038,001 B1 | 7/2018 | Wang |
| 10,066,965 B2 | 9/2018 | Foletto et al. |
| 10,297,605 B2 | 5/2019 | Wang |
| 10,411,498 B2 | 9/2019 | Shoemaker et al. |
| 10,430,296 B2 | 10/2019 | Cesaretti et al. |
| 10,573,364 B1 | 2/2020 | Sanjeevarao et al. |
| 10,635,539 B2 | 4/2020 | Cook et al. |
| 10,706,948 B2 | 7/2020 | Biberidis et al. |
| 2004/0218420 A1* | 11/2004 | Aakjer ............... G11C 16/3418 365/185.02 |
| 2006/0129370 A1 | 6/2006 | Unger |
| 2007/0168718 A1 | 7/2007 | Reblewski et al. |
| 2010/0052424 A1 | 3/2010 | Taylor et al. |
| 2010/0169740 A1 | 7/2010 | Jagasivamani et al. |
| 2016/0231393 A1 | 8/2016 | Fernandez et al. |
| 2016/0247577 A1 | 8/2016 | Lee |
| 2018/0259594 A1 | 9/2018 | Fernandez et al. |
| 2018/0267868 A1 | 9/2018 | Bose et al. |
| 2019/0370125 A1 | 12/2019 | Cesaretti et al. |
| 2019/0371415 A1 | 12/2019 | Cesaretti et al. |
| 2021/0158866 A1 | 5/2021 | Sethuraman et al. |

OTHER PUBLICATIONS

U.S. Non-Final Office Action dated Apr. 30, 2021 for U.S. Appl. No. 16/695,968; 13 Pages.
Response to U.S. Non-Final Office Action dated Apr. 30, 2021 for U.S. Appl. No. 16/695,968; Response filed May 3, 2021; 10 Pages.
Response to Office Action filed on Jul. 7, 2021 for U.S. Appl. No. 16/822,119; 9 pages.
Notice of Allowance dated Jul. 23, 2021 for U.S. Appl. No. 16/822,119; 8 pages.
Notice of Allowance and Issue Fee due dated May 19, 2021 for U.S. Appl. No. 16/695,968; 7 Pages.
U.S. Appl. No. 16/695,968, filed Nov. 26, 2019, Rigoni et al.
U.S. Appl. No. 16/821,155, filed Mar. 17, 2020, Rigoni et al.
U.S. Appl. No. 16/822,119, filed Mar. 18, 2020, Sarwar et al.
U.S. Non-Final Office Action dated Jun. 24, 2021 for U.S. Appl. No. 16/822,119; 11 Pages.

* cited by examiner

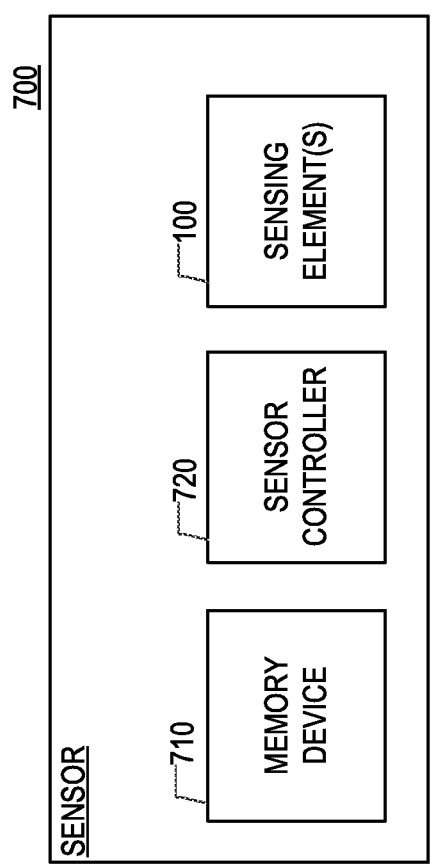

METHOD AND APPARATUS FOR ELIMINATING BIT DISTURBANCE ERRORS IN NON-VOLATILE MEMORY DEVICES

BACKGROUND

Non-volatile memory is a type of memory that can stored information by controlling a physical variable and retain it after it is powered off. Many electronic devices are operated under harsh thermal conditions, such as automotive sensors, automotive control systems, industrial sensors, and industrial control systems, use non-volatile memory to store data. In such applications, the ability of non-volatile memory to endure its retention over disturbances created by writing of neighbor cells over temperature and process variations is crucial to the safe and reliable operation of the electronic devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method is provided for use in a memory device having a data storage module and a controller that is operatively coupled to the data storage module, the method comprising: performing a first read from an address in the data storage module by using a first read voltage; storing, in a first register, data that is retrieved from the data storage module as a result of the first read; performing a second read from the address by using a second different read voltage; storing, in a second register, data that is retrieved from the data storage module as a result of the second read; detecting whether a weak bit condition is present at the address based on the data that is stored in the first register and the data that is stored in the second register; and correcting the weak bit condition when the weak bit condition is present at the address.

According to aspects of the disclosure, a system is provided comprising: a data storage module; and a processing circuitry operatively coupled to the data storage module, wherein the processing circuitry is configured to perform the operations of: performing a first read from an address in the data storage module by using a first read voltage; storing, in a first register, data that is retrieved from the data storage module as a result of the first read; performing a second read from the address by using a second different read voltage; storing, in a second register, data that is retrieved from the data storage module as a result of the second read; detecting whether a weak bit condition is present at the address based on the data that is stored in the first register and the data that is stored in the second register; and correcting the weak bit condition when the weak bit condition is present at the address.

According to aspects of the disclosure, a sensor comprising: a sensor controller; one or more sensing elements operatively coupled to the sensor controller; and a memory operatively coupled to the controller, the memory including a data storage module and a processing circuitry operatively coupled to the data storage module, the processing circuitry being configured to perform the operations of: performing a first read from an address in the data storage module by using a first read voltage; storing, in a first register, data that is retrieved from the data storage module as a result of the first read; performing a second read from the address by using a second different read voltage; storing, in a second register, data that is retrieved from the data storage module as a result of the second read; detecting whether a weak bit condition is present at the address based on the data that is stored in the first register and the data that is stored in the second register; and correcting the weak bit condition when the weak bit condition is present at the address.

According to aspects of the disclosure, a non-transitory computer-readable medium storing one or more processor executable instructions, which when executed by at least one processor cause the processor to perform the operations of: performing a first read from an address in a data storage module by using a first read voltage; storing, in a first register, data that is retrieved as a result of the first read; performing a second read from the address by using a second read voltage; storing, in a second register, data that is retrieved as a result of the second read; detecting whether the data that is stored in the first register matches the data that is stored in the second register, overwriting the address with the data stored in the second register, the address being overwritten in response to the data stored in the first register not matching the data stored in the second register.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
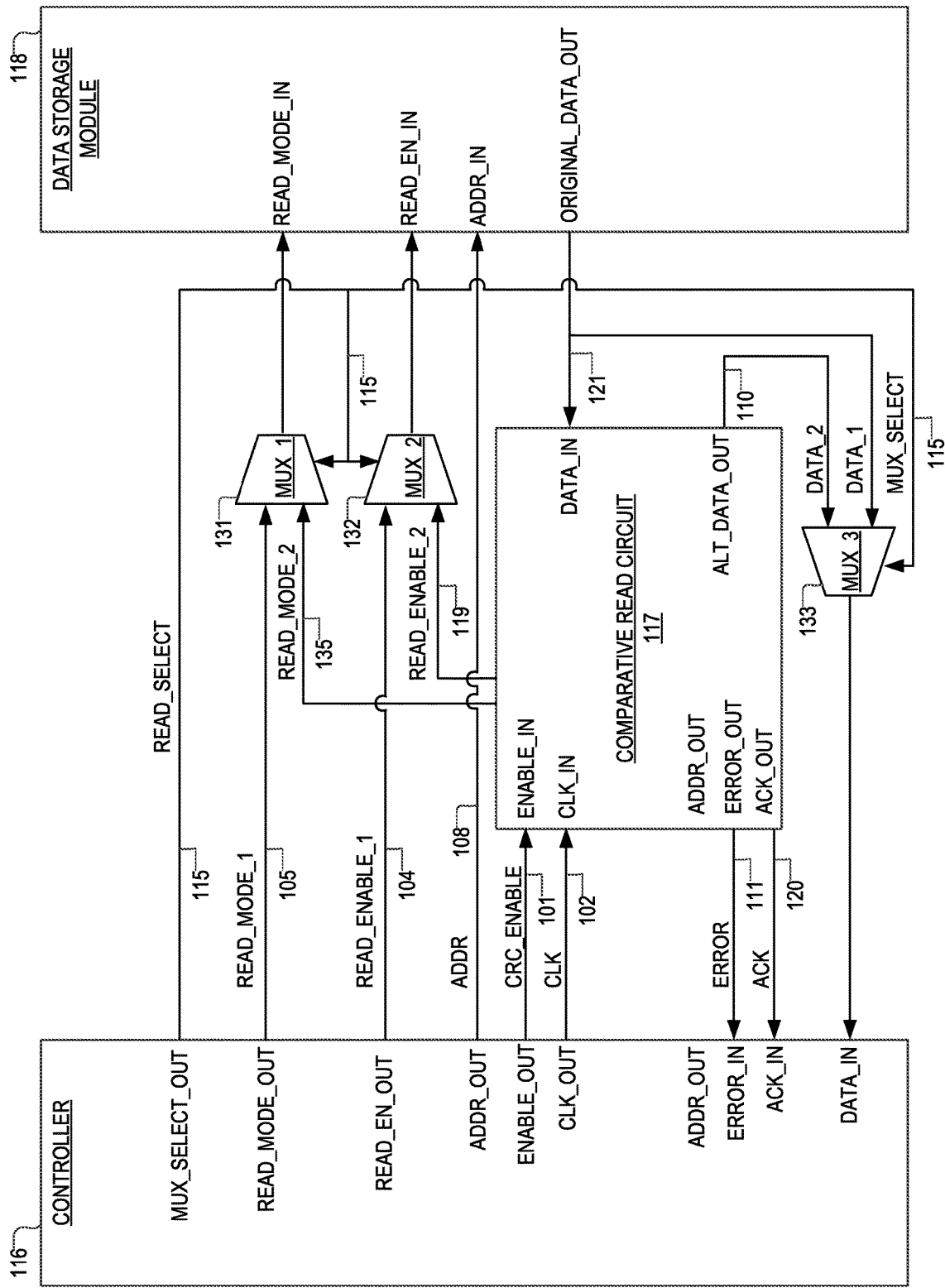
FIG. 1 is a side view of an example of a memory device, according to aspects of the disclosure.

According to aspects of the disclosure, an Electrically Erasable Programmable Read-Only Memory (EEPROM) device is disclosed that is configured to execute a process for preventing the occurrence weak bit conditions within the EEPROM device. A weak bit condition may occur when the EEPROM device is exposed to elevated operating temperatures (e.g., 85 C or more), and is characterized by the threshold voltage of cells (e.g., floating gate transistors, etc.) in the EEPROM device being increased or decreased, which in turn could cause errors when data stored in the cells is attempted to be retrieved. Accordingly, the presence of one or more weak bit conditions in the EEPROM device may cause the EEPROM device to malfunction and provide corrupt data as a result.

The EEPROM device, in some implementations, may support at least three different read voltages. In the example embodiment described herein the three near voltages are sometime characterized as a low voltage (e.g., 0V), a nominal voltage (e.g., 1.4V), and a high voltage (e.g., 2.8V). Read operations performed by using the low read voltage are herein referred to as "low voltage reads", read operations performed by using the nominal read voltage are herein referred to as "nominal voltage reads", and read operations performed by using the high read voltage are herein referred to as "high voltage reads." It should, of course, be appreciated that the references made herein to certain name (e.g. "low voltage", "nominal voltage," "high voltage" or to certain voltage levels or ranges (e.g. 0 v, 1.4 v or 2.8 v) are made only to promote clarity in the description of the broad concepts taught herein and are not intended as and should not be construed as limiting.

Weak bit conditions may be said to exist in the EEPROM device when a nominal voltage read from a particular address in the EEPROM device returns different data than a low voltage read or a high voltage read that is performed at the same address. There may be two different types of weak bit conditions—namely, weak '0' conditions and weak '1' conditions. A weak '0' condition may be present in a cell of the EEPROM device when a nominal voltage read from the cell yields a '0' and a low voltage read from the same cell yields a '1'. By contrast, a weak '1' condition may be present in a cell of the EEPROM device when a nominal voltage read from the cell yields a '1' and a high voltage read from the same cell yields a '0'.

Each address in the EEPROM device may be associated with a set of cells, which together form a word. According to the present disclosure, an address in the EEPROM device is said to experience a weak bit condition when any of the cells associated with the address is experiencing a weak bit condition. Furthermore, according to the present disclosure, the phrase "generating data" may refer to either retrieving data that is stored in one or more cells of an EEPROM device (or register) or actively processing data that is retrieved from the EEPROM device (and/or one or more registers) to produce new data or produce a copy of the data that is retrieved vie one of a low voltage red, a nominal voltage read, and a high voltage read. According to the present disclosure, an address in the EEPROM device is said to be written to, when data is stored in the cells associated with the address. According to the present disclosure, an address in the EEPROM device is said to be read from, when data is retrieved from the cells associated with the address. Similarly, according to the present disclosure, an address in the EEPROM device is said to be reset, when the cells associated with the address are reset.

In some implementations, the process for preventing weak bit conditions may be integrated with the servicing of incoming read requests by the EEPROM device. When a read request is received at the EEPROM device for a given address, the EEPROM device may perform a low voltage read, a nominal voltage read, and a high voltage read from the given address. If the data returned in response to the nominal voltage read differs from the data returned in response to the low voltage read and/or the high voltage read, the EEPROM device may detect that a weak bit condition is present at the address. Afterwards, the EEPROM device may generate corrected data, reset the address, and write the corrected data to the address. Resetting and overwriting the address with the corrected data has the effect of removing any weak bit conditions that are present at the address, thereby increasing the reliability of the EEPROM device.

FIG. 1 is a diagram of an example of a memory device 100, according to aspects of the disclosure. As illustrated, the memory device 100 may include a controller 116, a data storage module 118, a comparative read circuit 117, a multiplexer 131, a multiplexer 132, and a multiplexer 133.

The controller 116 may include an EEPROM controller and/or any other suitable type of memory controller. The data storage module 118 may include a matrix of EEPROM memory cells, and/or any other suitable type of data storage module. The comparative read circuit 117 may include a circuit that is configured to detect and correct weak-bit conditions in the data storage module 118. The operation of the comparative read circuit is discussed further below with respect to FIGS. 2-6B.

The controller 116 may be configured to enable the comparative read circuit 117 by using a signal 101. When the signal 101 is set to a first logical value (e.g. a logic high value), the comparative read circuit 117 may be enabled. When the signal 101 is set to a second, different logic value (e.g. a first logic low value), the comparative read circuit may be disabled. The controller 116 may be further configured to drive the comparative read circuit 117 with a clock signal 102, as shown. In addition, the controller may be configured to apply an address signal 108 to the data storage module 118. The address signal 108 may specify an address in the data storage module 118 from which data is requested to be retrieved.

The comparative read circuit 117 may be configured to test whether one or more weak bit conditions are present at the address identified by the address signal 108. The performance of the test may be triggered, by the controller 116, by setting the signal 101 to a logic high value. Before the test is started, the comparative read circuit 117 may set each of the ack signal 120 and the error signal 111 first logic value (e.g. a to a logic low value). When the test is completed, the comparative read circuit 117 may set the ack signal 120 to a second different logic code value (e.g. a logic high value), thereby notifying the controller 116 that test has been completed. In addition, if one or more weak bit conditions are present at the address, the comparative read circuit 117 may set the error signal 111 to a first logic value (e.g. a logic high value), thereby notifying the controller 116 that one or more weak bit conditions have been detected at the address specified by the address signal 108.

Each of the signals 105 and 135 may be a read mode signal. According to the present example, a read mode signal is a signal that selects the read voltage for data retrieval operations that are performed by the data storage module 118. Each of the signals 105 and 135 may have at least three possible values. In the example embodiment described herein the three values are herein referred to as a low-voltage value, a nominal-voltage value, and a high-voltage value. When the read mode signal applied (by the multiplexer 131) to the data storage module 118 is set to the low-voltage value, the data storage module 118 may perform read operations by using a low read voltage (e.g., 0V). When the read mode signal that is applied (by the multiplexer 131) to the data storage module 118 is set to the nominal-voltage value, the data storage module 118 may perform read operations by using a nominal read voltage (e.g., 1.4V). When the read mode signal that is applied (by the multiplexer 131) to the data storage module 118 is set to the high-voltage value, the data storage module 118 may perform read operations by using a high read voltage (e.g., 2.8V). It should, of course, be appreciated that the references made herein to certain name (e.g. "low voltage", "nominal voltage," "high voltage" or to certain voltage levels or ranges (e.g. 0 v, 1.4 v or 2.8 v) are made only to promote clarity in the description of the broad concepts taught herein and are not intended as and should not be construed as limiting.

Each of the signals 104 and 119 may be a read enable signal. According to the present example, a read enable signal is a signal that triggers the data storage module 118 to perform a read operation. Setting the read enable signal to a first logic value (e.g. a logic high value) may cause the data storage module 118 to retrieve data from the address specified by address signal 108 and output the retrieved data via the data signal 121. The data may be retrieved by using a read voltage that is specified by the read mode signal that is applied to the data storage module (e.g., by the multiplexer 131).

The data storage module 118 may be configured to receive a read mode signal from the multiplexer 131 and a read enable signal from the multiplexer 132. As noted above, depending on the value of the signal 115, the read mode signal received at the data storage module 118 may be one of the signal 105 (generated by the controller 116) and the signal 135 (generated by the comparative read circuit 117). Furthermore, depending on the value of the signal 115, the read enable signal received at the data storage may be one of the signal 104 (generated by the controller 116) and the signal 135 (generated by the comparative read circuit 117).

The signal 115 determines which one of the controller 116 and the comparative read circuit 117 is in charge of applying the read mode and read enable signals to the data storage module. As noted above, when the signal 115 is set to a logic low value, read operations are performed by the data storage module 118 in accordance with read mode and read enable signals that are generated by the controller 116. When the signal 115 is set to a logic high value, read operations are performed by the data storage module 118 in accordance with read mode and read enable signals that are generated by the comparative read circuit.

Furthermore, the signal 115 determines whether data provided by the comparative read circuit or data provided by the data storage module 118 will be returned in response to read requests. When the signal 115 is set to a logic low value, data 121 may be provided directly to the controller 116 (by the data storage module 118), without passing through the comparative read circuit 117 first. By contrast, when the signal 115 is set to a logic high values, data returned in response to read requests is provided by the comparative read circuit 117.

The controller 116 may be configured to execute read requests that are received from an external device. Executing any of the read requests may include obtaining return data associated with the request and providing the return data to the external device. Any of the read requests may be executed either in a normal mode or in a comparative mode. When a read request is executed in a normal mode, the controller 116 may obtain return data directly from the data storage module 118, without involving the comparative read circuit 117, after which the controller 116 may provide the return data to the external device. To execute a read request in a normal mode, the controller 116 may set the signal 115 to a logic low value, set the signal 105 to a nominal-voltage value, set the signal 104 to a logic high value, and apply the address associated with the read request at address signal 108 until return data (i.e., the data stored at the address) is received by the controller 116 from the data storage module 118.

When a read request is executed in a comparative mode, the controller 116 may obtain return data by using the comparative read circuit 117, and subsequently provide the return data to the external device. To execute a read request in a comparative mode, the controller 116 may set the signal 115 to a logic high value, set the signal 101 to a logic high value (to enable the comparative read circuit 117), and apply the address associated with the read request at signal 108 until return data (i.e., the data stored at the address) is received by the controller 116 from the comparative read circuit 117.

In addition, when a read request is executed in a comparative mode, the controller may detect whether one or more weak bit conditions are present at the address associated with the read request. The detection may be performed by examining the value of the error signal 111 at the time when return data associated with the read request is received from the comparative read circuit 117. If the error signal 111 is set to a logic high value, the controller 116 may determine that one or more weak bit conditions are present at the address. When one or more weak bit conditions are present at the address, the controller may reset the address, and subsequently write the return data (received from the comparative read circuit 117) to the address. Performing these actions removes any weak bit conditions that are present in the cells (e.g., EEPROM cells) associated with the address, while retaining the data that they are configured to store. For the sake of clarity, signal lines used for the writing of data from the controller 116 to the data storage module 118 are omitted from FIG. 1. However, those of ordinary skill in the art will readily recognize how to write data from a controller to a storage device. In this regard, it will be understood that the present disclosure is not limited to any specific method for writing data received at the controller 118 to the data storage module 118.

Although in the example of FIG. 1, different components of the circuit 117 are driven by setting signals (e.g., the ack signal 120, error signal 111, etc.) to a logic high value, alternative implementations are possible in which the components are driven by setting any of these signals to a logic low value. In this regard it will be understood that examples in which a "logic high" value of a signal are used to induce action by one or more components of the circuit 100 are not intended to limit the disclosure in any way. Those of ordinary skill in the art will readily recognize that alternative implementations are possible in which the logic of the circuit 100 is inverted, and the same action is induced by setting the signal to a logic low value.

Figures 2, 3:
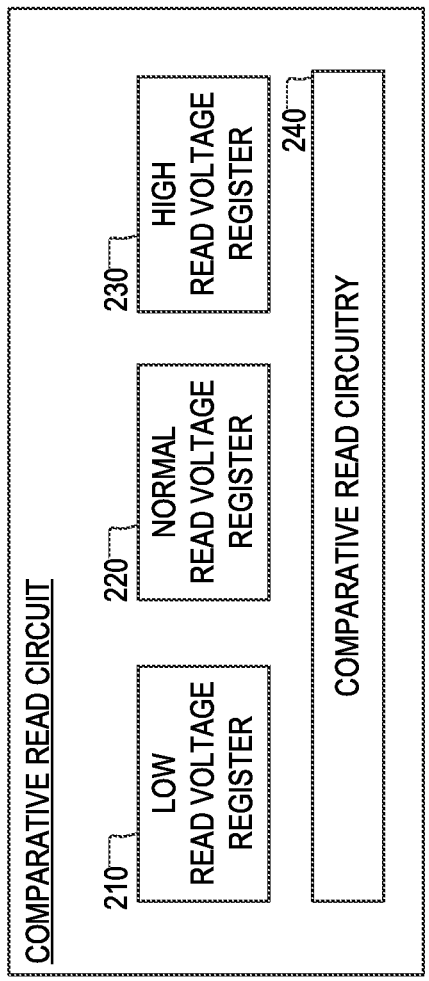
FIG. 2 is a diagram of an example of a comparative read module, according to aspects of the disclosure.
FIG. 3 is a diagram of an example of a table, according to aspects of the disclosure.

FIG. 2 is a diagram of an example of the comparative read circuit 117, according to aspects of the disclosure. As illustrated, the comparative read circuit 117 may include first, second and third read registers 210. 220, and 230. For example, read registers 210, 220, 230 may be provided as a low-voltage read register 210, a nominal-voltage read register 220, and a high-voltage read register 230 that are operatively coupled to comparative read circuitry 240. The circuitry 240 may include any suitable type of processing circuitry that is configured to detect weak bit conditions at a given address in the data storage module 118. In operation, the circuitry 240 may perform a low voltage read, a nominal voltage read, and a high voltage read while the same read address is being asserted (via address signal 108) at the data storage module 118. In other words, each of the voltage read, the nominal voltage read, and the high voltage read may be performed from the same address of data storage module.

Data retrieved as a result of the low voltage read may be stored in the register 210; data retrieved as a result of the nominal voltage read may be stored in the register 220; and data retrieved as a result of the high voltage read may be stored in the register 230. After the low-voltage, nominal-voltage, and high-voltage reads are completed, the circuitry 240 may compare the data that is stored in the registers 210, 220, and 230. If the data stored in register 210 is different from the data stored in register 220, circuitry 240 may determine that a weak '0' condition is present at the address. If the data stored in register 230 differs from the data that is stored in the register 220, the circuitry 240 may determine that a weak '1' condition is present at the address. When a weak bit condition is detected, the circuitry 240 may notify the controller 116 by setting the error signal 111 to a logic high value.

To test whether a weak '0' condition is present at the address, the circuitry 240 may perform a bitwise comparison of the data stored in registers 210 and 220. More specifically, the circuitry 240 may compare each n-th bit in register 210 with the n-th bit in register 220, where n is an integer greater than 0 and less than or equal to the total number of bits in the data stored in registers 210 and 220 (e.g., the word size of the data storage module 118). If the n-th bit in register 210 is equal to '1' and the n-th bit in register 220 is equal to '0', the circuitry 240 may determine that a weak '0' condition is present at the address in the data storage module 118 from which the data in registers 210 and 220 is retrieved.

To test whether a weak '1' condition is present at the address, the circuitry 240 may perform bitwise comparison of the data stored in registers 230 and 220. More specifically, the circuitry 240 may compare each n-th bit in register 230 with the n-th bit in register 220. If the n-th bit in register 230 is equal to '0' and the n-th bit in register 220 is equal to '1', the circuitry 240 may determine that a weak '1' condition is present at the address in the data storage module 118 from which the data in registers 230 and 220 is retrieved.

The circuitry 240 may be configured to generate return data associated with the address and provide the return data to the controller 116 (via signal 110). When no weak bit conditions are detected, the return may include a copy of the data stored in any of registers 210-220. On the other hand, when one or more bit conditions are detected the return data may include corrected data. Specifically, generating the corrected data may include inserting a corrected bit at each position in the return data for which a weak bit condition is detected. Returning to the example above, if a weak bit condition is detected for any n-th bit of the data stored in registers 210, 220, and 230, a corrected bit may be inserted at the n-th position in the corrected data. For instance, if the third bit in the register 210 is '1' and the third bit in register 220 is '0', the circuitry 240 may: (i) detect that a weak '0' condition exists with respect to the third bit of the data stored in registers 210 and/or 220, (ii) generate a corrected bit, and (iii) insert the corrected bit at the third position in the corrected data. As another example, if the fifth bit in the register 220 is '1' and the third bit in register 230 is '0', the circuitry 240 may: (i) detect that a weak '1' condition exists with respect to the fifth bit of the data stored in registers 220 and/or 230, (ii) generate a corrected bit, and (iii) insert the corrected bit at the fifth position in the corrected data. In some implementations, the corrected bits can be generated in the manner discussed below with respect to FIG. 3.

FIG. 3 shows a table 300 that illustrates the relationship the conditions under which weak '0' bits and weak '1' bits are detected. As illustrated, a weak '0' condition may be said to exist with respect to a particular cell in the data storage module 118 when a low-voltage read from that cell yields a '1' and a nominal-voltage read from the same cell yields '0'. In such instances, a corrected bit may be generated for the cell that is equal to '0'. The corrected bit may be generated by using an AND gate to combine the bit returned in response to the low-voltage read with the bit returned in response to the nominal-voltage read. Similarly, table 300 illustrates that a weak '1' condition may be said to exist with respect to a particular cell in the data storage module 118 when a high-voltage read from that cell yields a '0' and a nominal-voltage read from the same cell yields '1'. In such instances, a corrected bit may be generated for the cell that is equal to '1'. The corrected bit may be generated by using an OR gate to combine the bit returned in response to the low-voltage read with the bit returned in response to the nominal-voltage read.

Figure 4:
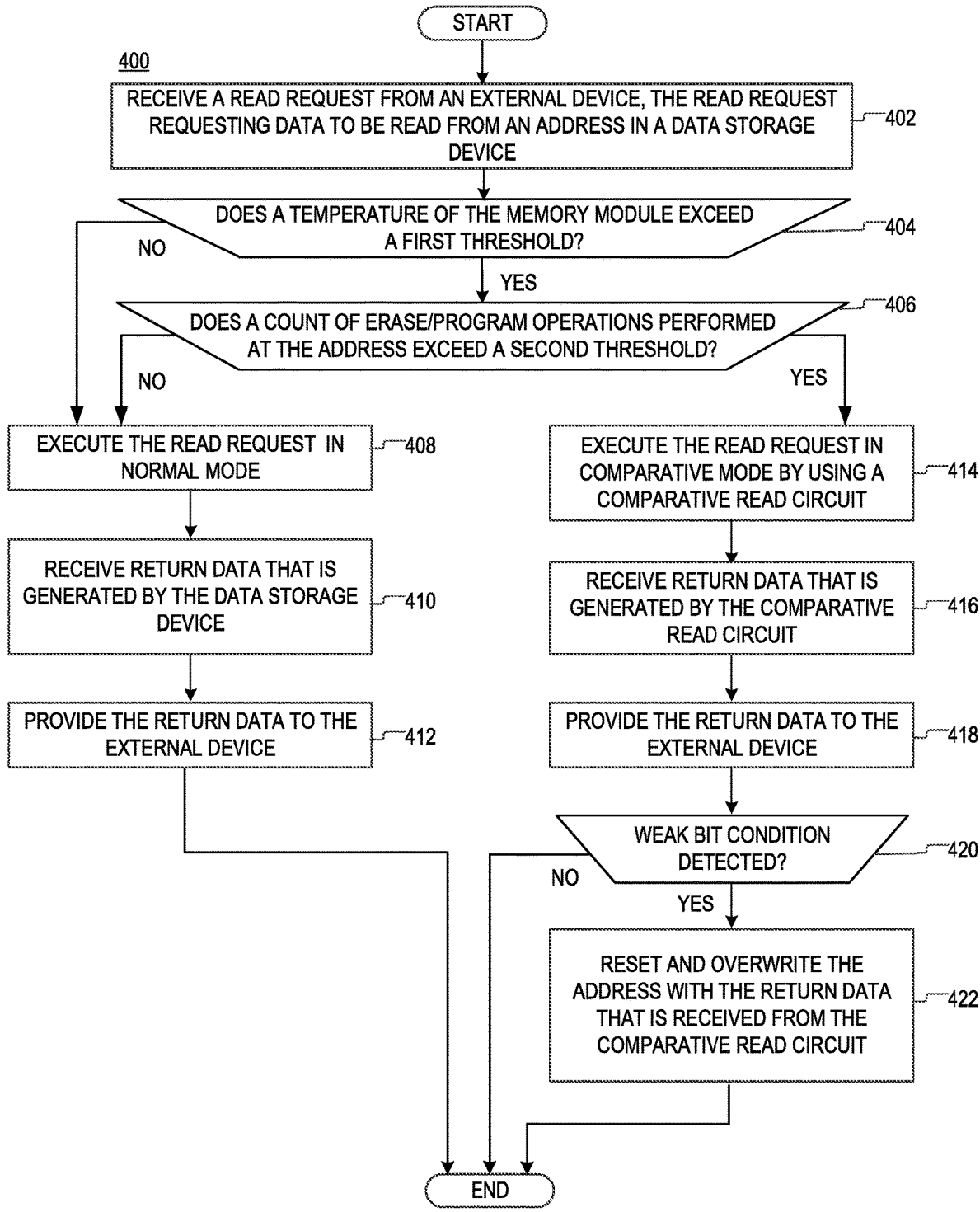
FIG. 4 is a flowchart of an example of a process, according to aspects of the disclosure.

FIG. 4 is a flowchart of an example of a process 400 that is performed by the controller 116, according to aspects of the disclosure.

At step 402, the controller 116 receives a read request. The read request may specify an address in the data storage module 118 from which data is requested to be read. The read request may be received from a device that is external to the memory device 100, such as the sensor controller 720, which is discussed with respect to FIG. 7. In some implementations, the external device may be formed on the same die as the memory device 100 and it may be contained within the same semiconductor packaging as the memory device 100. Alternatively, in some implementations, the internal device may be contained in a different semiconductor packaging.

At step 404, a determination is made if the temperature of the data storage module 118 exceeds a first threshold. In some implementations, making the determination may include receiving a temperature reading from a temperature sensor (not shown) that is coupled to the controller 116, and detecting whether the temperature identified by the reading exceeds the first threshold. If the temperature does not exceed the first threshold, the process proceeds to step 408. Otherwise, if the temperature does exceeds the first threshold, the process proceeds to step 406.

At step 406, a determination is made if a count of erase/program operations performed at the address exceeds a second threshold. In some implementations, making the determination may include retrieving in a well-known fashion a counter value that identifies the number of erase/program operations performed at the address, and detecting whether the counter value exceeds the second threshold. If the counter value does not exceed the threshold, the process 400 proceeds to step 408. Otherwise, if the counter value exceeds the threshold, the process 400 proceeds to step 414.

At step 408, the controller 116 performs a memory read operation in normal mode. At step 410, the controller 116 receives return data that is generated by the data storage module 118 in response to the memory read operation. At step 412, the controller 116 provides the received data to the external device that is the source of the read request received at step 402.

At step 414, the controller 116 performs a memory read operation in a comparative mode. At step 416, the controller 116 receives return data that is generated by the comparative read circuit 117 in response to the memory read operation. At step 418, the controller 116 provides the return data received at step 416 to the external device that is the source of the read request received at step 402.

At step 420, the controller 116 determines whether one or more weak bit conditions have been detected by the comparative read circuit 117. The detection may be performed by examining the value of the error signal 111. If the error signal 111 is set to a logic high value, the controller 116 determines that at least one weak-bit condition has been detected by the comparative read circuit, and the process 400 proceeds to step 422. Otherwise, if the error signal 111 is set to a logic low value, the controller 116 determines that no weak bit conditions have been detected by the comparative read circuit 117, and the process 400 ends.

At step 422, the controller 116 resets the address and writes the return data received at step 416 back to the specified address. In some respects, resetting the address and writing to the address the return data received from the comparative read circuit 117. As discussed above, overwriting the address in this manner may have the effect of removing any weak bit conditions that are present at the address.

Figure 5:
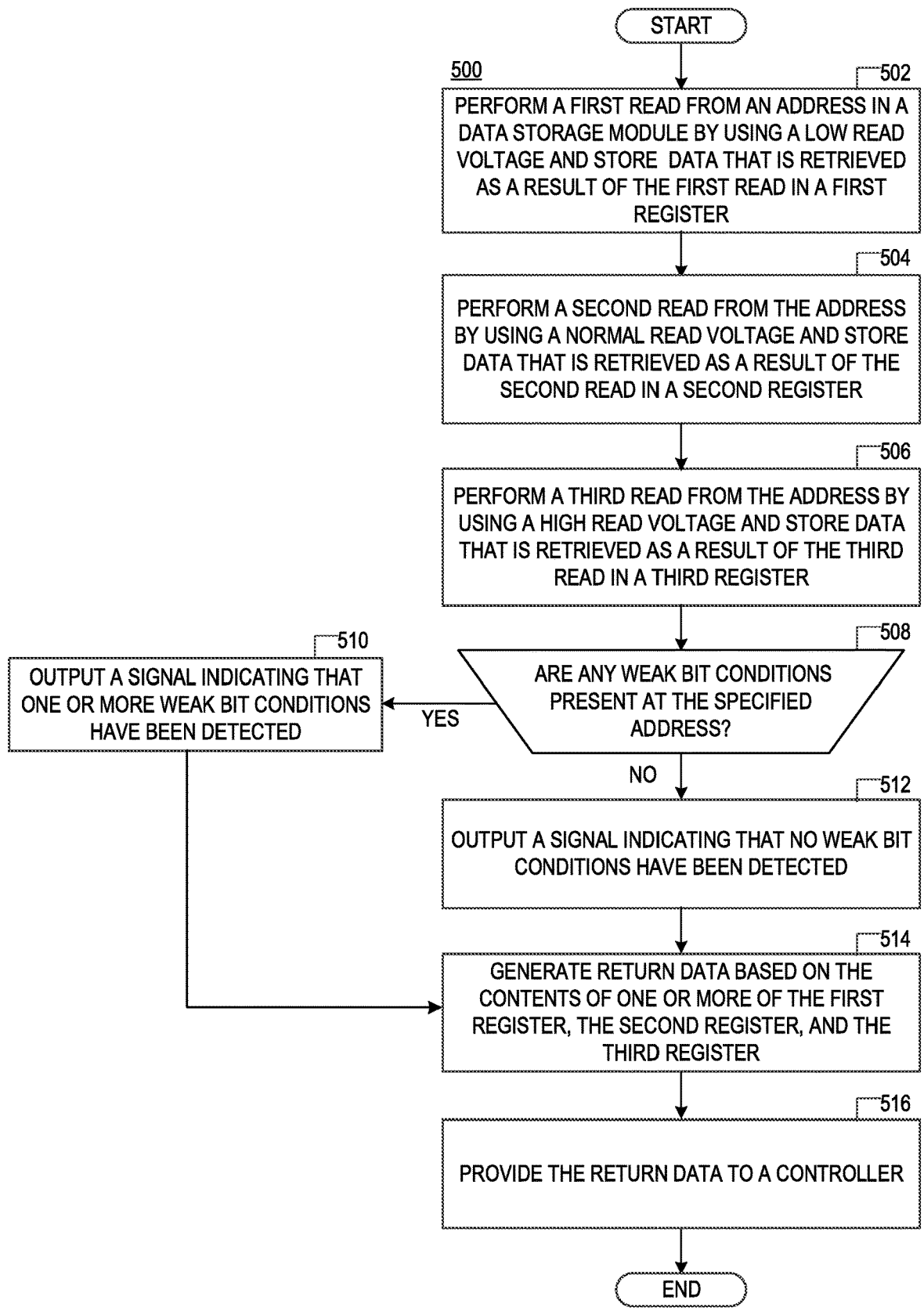
FIG. 5 is a flowchart of an example of a process, according to aspects of the disclosure.

FIG. 5 is a flowchart of an example of a process 500 for detecting weak bit conditions at a specified address. The address may include an address received with a read request and/or any other suitable type of address in the data storage module 118. According to the present example, the process 500 is performed by the comparative read circuit 117. However, it will be understood that alternative implementations are possible in which the process 500 is performed by the controller 116 and/or another component of the memory device 100.

At step 502, the comparative read circuit 117 performs a low voltage read from the address and stores, in the register 210, data that is returned by the data storage module 118 in response to low voltage read. At step 504, the comparative read circuit 117 performs a nominal voltage read from the address and stores, in the register 220, data that is returned by the data storage module 118 in response to nominal voltage read. At step 506, the comparative read circuit 117 performs a high voltage read from the address and stores, in the register 230, data that is returned by the data storage module 118, in response to high voltage read. At step 508, the comparative read circuit 117 determines whether one or more weak bit conditions are present at the address. The determination may be made by comparing the data stored in the registers 210, 220, and 230. If the data stored in the register 220 matches the data stored in registers 210 and 230, the comparative read circuit 117 may determine that no weak-bit conditions exist and the process 500 proceeds to step 512. If the data stored in the register 220 differs from the data stored in any of the registers 210 and 230, the comparative read circuit 117 may determine that at least one weak-bit condition exists at the address, and the process proceeds to step 510.

At step 510, the comparative read circuit outputs a signal indicating that one or more weak bit conditions have been detected at the address. In some implementations, outputting the signal may include setting the error signal 111 to the first error signal value. At step 512, the comparative read circuit outputs a signal indicating that no weak bit conditions have been detected at the address. In some implementations, outputting the signal may include setting the error signal 111 to the second error signal value. As can be readily appreciated, step 512 can be omitted if the error signal 111 have been reset (i.e., set to a logic low value before executing the process 500).

At step 514, the comparative read circuit 117 generates return data based on one or more of: (i) the data stored in the register 210, (ii) the data stored in the register 220, and (iii) the data stored in the register 230. In instances in which no weak bit conditions are detected at the address, generating the return data may include generating a copy of the data stored in one of registers 210, 220, and 230. On the other hand, in instances in which one or more weak bit conditions have been detected at the address, generating the return data may include generating corrected data. The corrected data may be generated in the manner discussed with respect to FIGS. 2-3. At step 516, the comparative read circuit 117 provides the generated return data to the controller 116 (via signal 110).

Figure 6A:
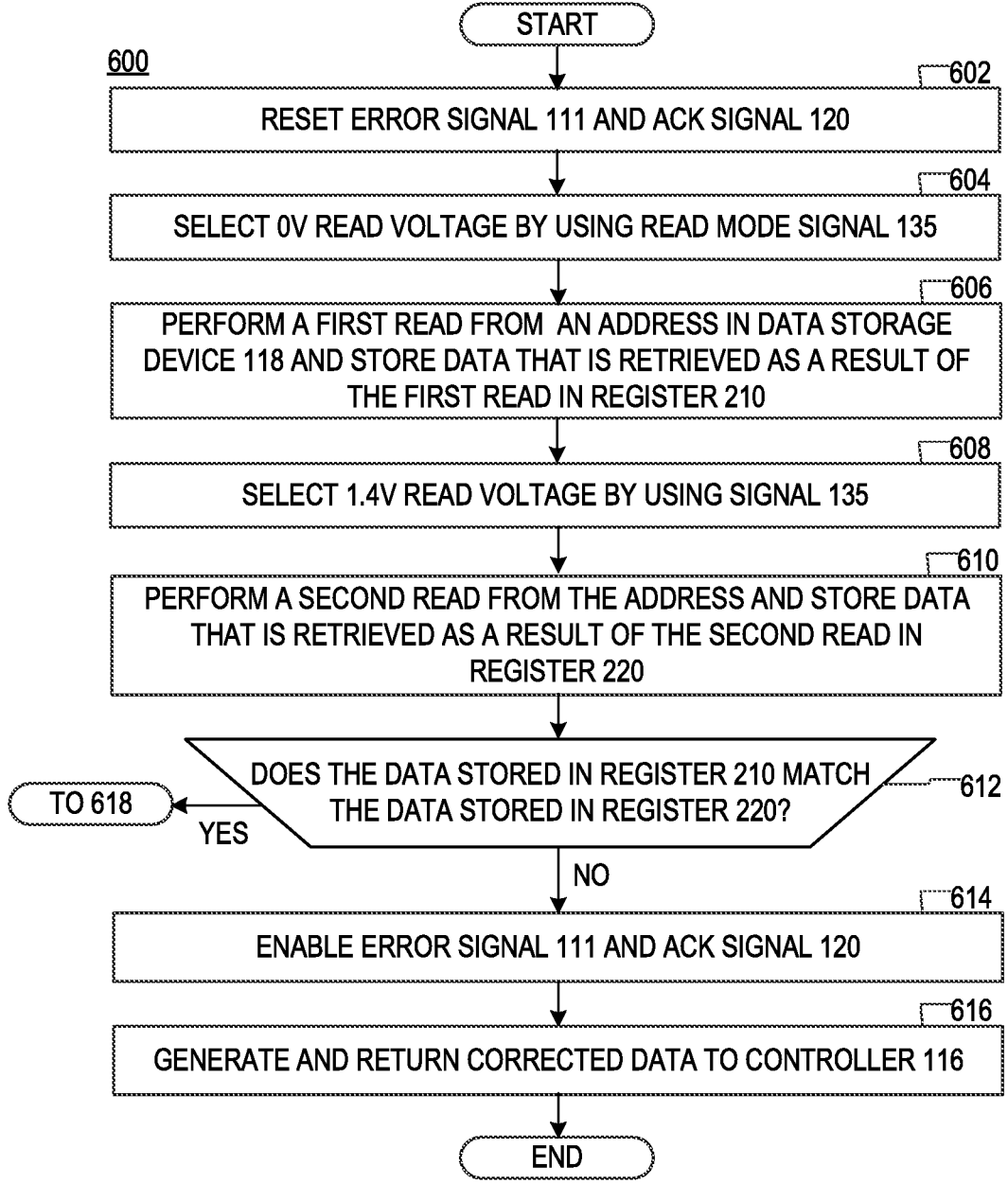
FIG. 6A is a flowchart of a portion of a process, according to aspects of the disclosure.
Figure 6B:
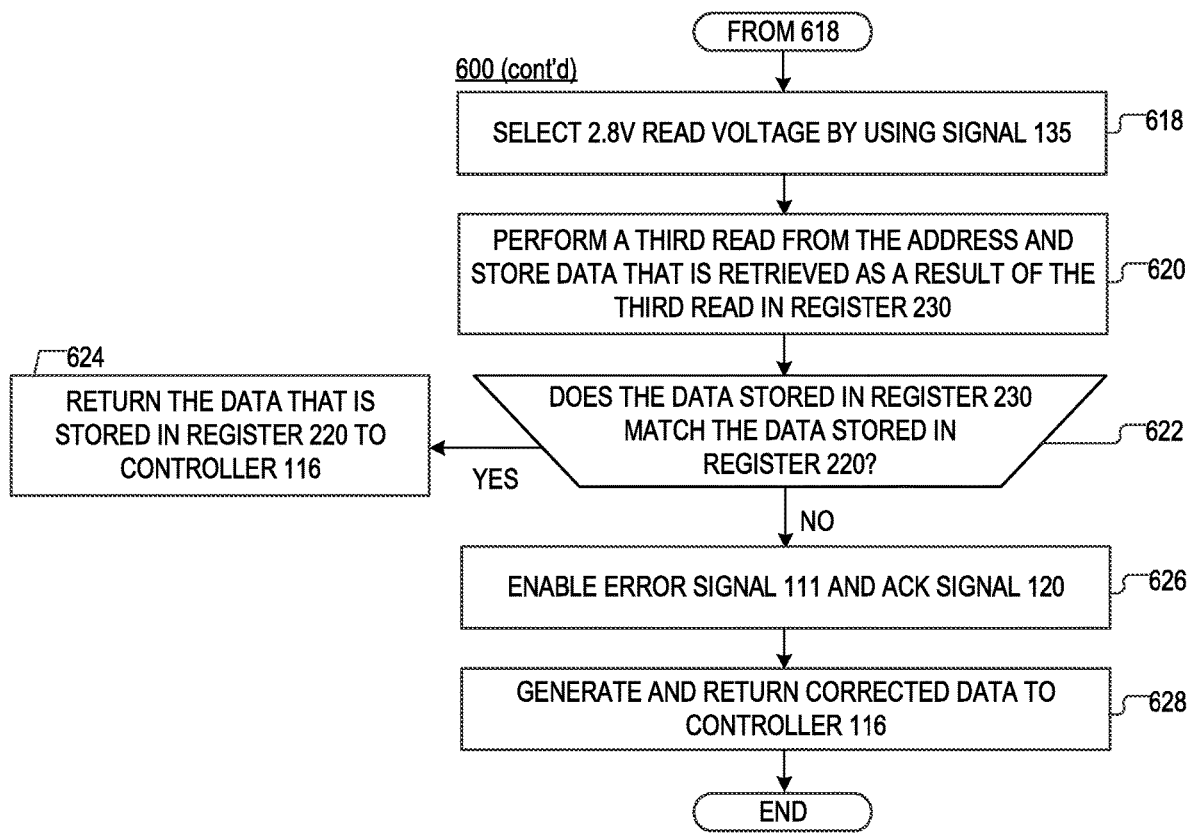
FIG. 6B is a flowchart of another portion of the process of FIG. 6A, according to aspects of the disclosure.

FIGS. 6A-B show an example of a process 600 for detecting weak bit conditions at a specified address. The address may include an address received with a read request and/or any other suitable type of address in the data storage module 118.

At step 602, the comparative read circuit 117 resets the error signal 111 and the ack signal 120. In some implementations, resetting each of the error signal 111 and the ack signal 120 may include setting each of the signals 111 and 120 to a logic low value.

At step 604, the comparative read circuit 117 selects a 0V read voltage. In some implementations, selecting the 0V read voltage may include setting the signal 135 to the low-voltage value.

At step 606, the comparative read circuit 117 performs a read from the address in the data storage module 118 (e.g., a low-voltage read), and stores data that is retrieved as a result of the read in the register 210. In some implementations, performing the read may include setting the signal 119 to a 'logic high' value and subsequently reverting the signal 119 to a logic low value after the data is received in response to the read.

At step 608, the comparative read circuit 117 selects a 1.4V read voltage. In some implementations, selecting the 1.4V read voltage may include setting the 135 to the nominal-voltage value.

At step 610, the comparative read circuit 117 performs a read from the address in the data storage module 118 (e.g., a nominal voltage read), and stores data that is retrieved as a result of the read in the register 220. In some implementations, performing the read may include setting the read enable signal 119 to a 'logic high' value and subsequently reverting the read enable signal 119 to a logic low value after the data is received in response to the read.

At step 612, the comparative read circuit 117 detects whether the data stored in the register 210 matches the data stored in the register 220. If the data stored in the register 210 matches the data stored in the register 220, this is an indication that there are no weak '0' conditions at the address, and the process 600 proceeds to step 618. If the data stored in the register 210 does not match the data stored in the register 220, this is an indication that there are one or more weak '0' conditions at the address, and the process 600 proceeds to step 614.

At step 614, the error signal 111 and the ack signal 120 are enabled. In some implementations, enabling the error signal 111 may include setting the error signal 111 to a logic high value. Similarly, enabling the ack signal 120 may include setting the ack signal 120 to a logic high value.

At step 616, the controller generates corrected data and returns the corrected data to the controller 116. The corrected data may be generated based on the contents of the register 210 and the register 220. In some implementations, the corrected data may be generated in the manner discussed with respect to FIGS. 2-3. As discussed above, the corrected data may be generated by executing a bitwise AND operation based on the contents of register 210 and register 220. The corrected data may be returned to the controller 116 via signal 110.

At step 618, the comparative read circuit 117 selects a 2.8V read voltage. In some implementations, selecting the 2.8V read voltage may include setting the signal 135 to the high-voltage value.

At step 620, the comparative read circuit 117 performs a read from the address in the data storage module 118 (e.g., a high voltage read), and stores data that is retrieved as a result of the read in the register 220. In some implementations, performing the read may include setting the read enable signal 119 to a 'logic high' value and subsequently reverting the read enable signal 119 to a logic low value after the data is received in response to the read.

At step 622, the comparative read circuit 117 detects whether the data stored in the register 230 matches the data stored in the register 220. If the data stored in the register 230 matches the data stored in the register 220, this is an indication that there are no weak '1' conditions at the address, and the process 600 proceeds to step 626. If the data stored in the register 230 does not match the data stored in the register 220, this is an indication that there are one or more weak '1' conditions at the address, and the process 600 proceeds to step 628.

At step 624, the comparative read circuit 117 returns to the controller 116 the data stored in the register 220. The data may be returned to the controller 116 via signal 110.

At step 626, the comparative read circuit 117 enables the error signal 111 and the ack signal 120. In some implementations, enabling the error signal 111 may include setting the error signal 111 to a logic high value. Similarly, enabling the ack signal 120 may include setting the ack signal 120 includes setting to a logic high value.

At step 628, the controller generates corrected data and returns the corrected data to the controller 116. The corrected data may be generated based on the contents of the register 220 and the register 230. As discussed above with respect to FIGS. 2-3, the corrected data may be generated by executing a bitwise OR operation based on the contents of register 220 and register 230.

Figure 7:
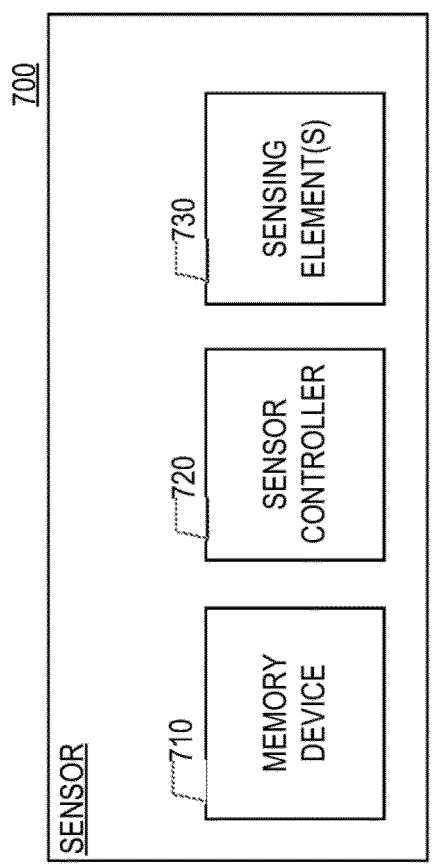
FIG. 7 is a diagram of an example of a sensor, according to aspects of the disclosure.
Figure 9:
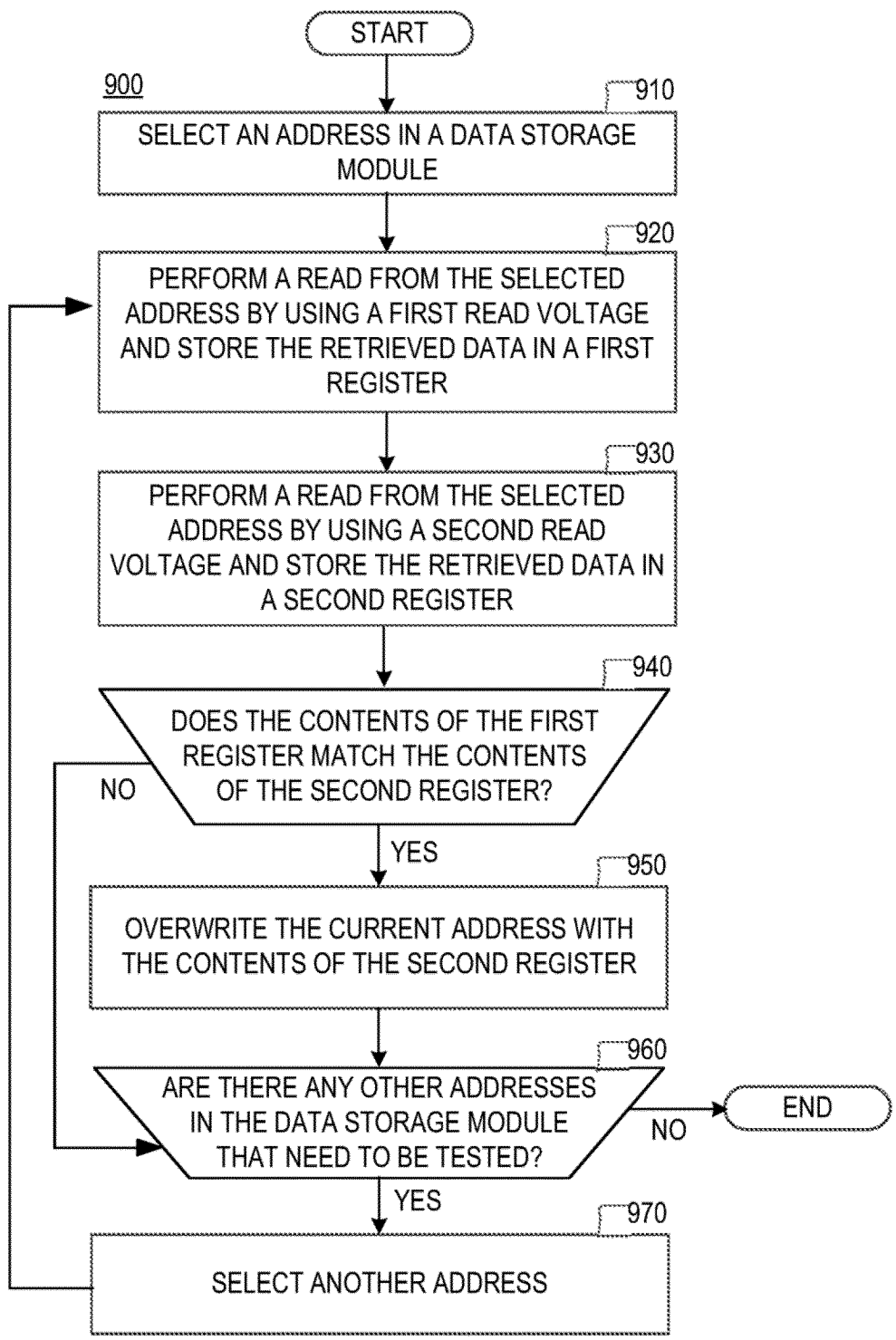

FIG. 7 is a diagram of an example of a sensor 700, according to aspects of the disclosure. The sensor 700 may include a memory device 710, a sensor controller 720, and one or more sensing elements 730. The memory device 710 may be the same or similar to the memory device 100. The sensor controller 720 may include any suitable type of processing circuitry that is configured to obtain digitized samples of signal(s) generated by the sensing elements 730 and process those signals to generate one or more output signals. To generate the output signals, the sensor controller 720 may repeatedly read and write data to the memory device. The one or more sensing elements 730 may include a Hall effect element, a magnetoresistive element (MRE), a temperature sensing element, a pressure sensing element, a photodiode, etc. In this regard, the sensor 700 may include a magnetic angle sensor, a current sensor, a temperature sensor, a pressure sensor, an optical sensor, and/or any other suitable type of sensor. Stated succinctly, the memory device 710 (and/or the memory device 100) is not limited to being in used conjunction with any specific type of sensor.

Figure 8:
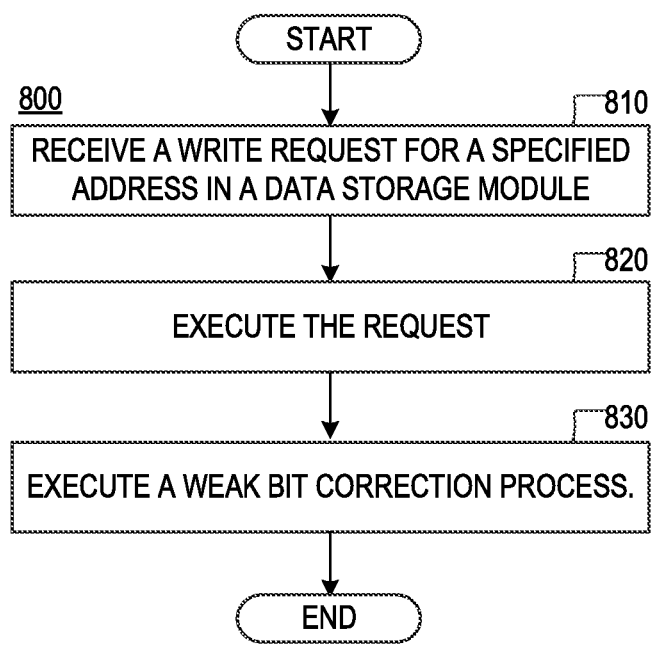
FIG. 8 is a flowchart of an example of a process, according to aspects of the disclosure.

FIG. 8 is a flowchart of an example of a process 800, according to aspects of the disclosure. In some implementations, the process 800 may be performed by a controller of an EEPROM data storage module, such as the data storage module 118. However, it will be understood that the present disclosure is not limited to any specific implementation of the process 800. At step 810, a write request is received at the controller. At step 820, the controller executes the write request by writing data associated with the write request to the data storage module. At step 830, the controller executes a weak-bit correction process to correct any weak-bit conditions in the data storage module that have occurred as a result of the execution of the write request. In some implementations, the weak-bit correction process may be performed as discussed further below with respect to FIG. 9. Additionally or alternatively, in some implementations, the weak-bit correction process may be performed as discussed further below with respect to FIG. 10.

Figure 9:
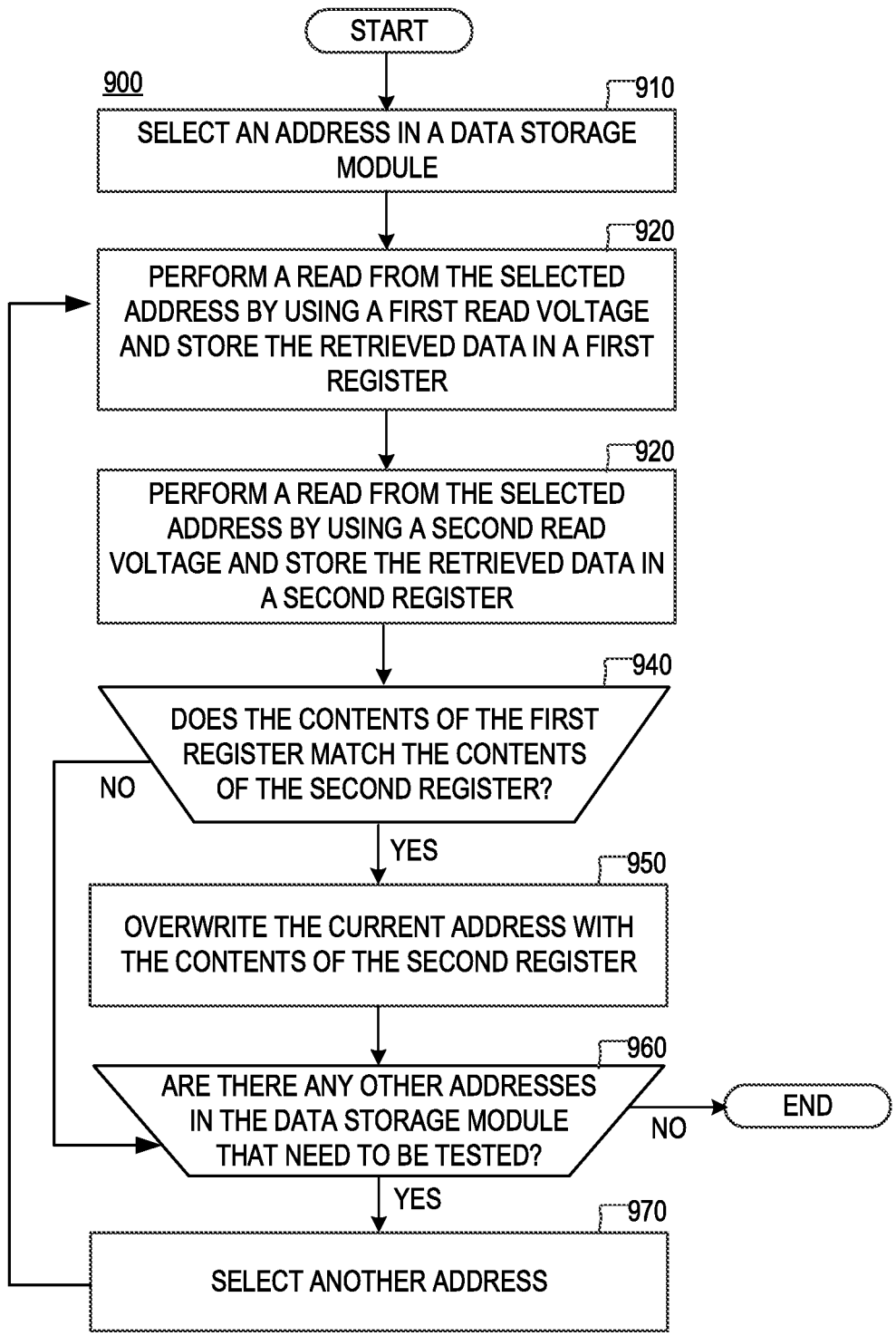
FIG. 9 is a flowchart of an example of a process, according to aspects of the disclosure.

FIG. 9 is a flowchart of an example of a process 900, for performing weak-bit correction on an EEPROM data storage module. In some implementations, the process 900 may be performed by a controller of an EEPROM data storage module, such as the data storage module 118. However, it will be understood that the present disclosure is not limited to any specific implementation of the process 900. At step 910, an address in the data storage module is selected. At step 920, a first read is performed from the selected address by using a first read voltage, and any data that that is retrieved as a result of the first read is stored in a first register. At step 930, a second read is performed from the selected address by using a second read voltage, and any data that is retrieved as a result of the second read is stored in a second register. At step 940, the contents of the second register is compared to the contents of the first register. If the contents of the second register matches (e.g., is equal to) the contents of the first register, this is an indication that no weak-bit condition exists at the selected address and the process 900 proceeds to step 960. Otherwise, if the contents of the second register does not match (e.g., is not equal to) the contents of the first register, this is an indication that a weak-bit condition exists at the selected address and the process 900 proceeds to step 950. At step 950, the weak-bit condition is corrected. According to the present example, the weak-bit condition is corrected by writing the contents of the second register back to the selected address. As can be readily appreciated, the writing operation may include erasing the current contents of memory cell(s) that are associated the selected address, and programming the same memory cell(s) to store the same contents as the second register. At step 960, a determination is made if there are any other addresses in the storage device that need to be tested. If there are no more addresses that need to be tested, the process 900 terminates. Otherwise, if there are more addresses that need to be tested, another address is selected at step 970, and the process 900 returns to step 920, after which steps 920-970 are repeated for the other address.

In some implementations, all addresses in the data storage device may be tested for a weak-bit condition after a write is performed on the data storage device. Moreover, in some implementations, all addresses in the data storage device may be tested every time a write is performed on the data storage device. In such implementations, the process 900 may be performed until all addresses in the data storage device has been tested. Additionally or alternatively, in some implementations, the first read may be a low-voltage read and the second read may be a normal-voltage read. In such implementations, the first read voltage may be (0V) and the second read voltage (1.4V). However, those of ordinary skill in the art would readily recognize that the specific values of the low read voltage and the normal read voltage of an EEPROM device may vary depending on the implementation of the EEPROM device. In this regard, it will be understood that the present disclosure is not limited to any specific value of the first read voltage and the second read voltage.

Although in the example of FIG. 9 only one address is processed at a time, alternative implementations are possible in which multiple addresses are processed in a batch mode. In such implementations, each of the addresses in a batch may be processed in parallel with each of the other addresses in the same batch. Processing any of the addresses in the batch may include executing steps 910-970 of the process 900 with respect to this address.

According to the example of FIG. 9 the addresses of the data storage module are processed in a sequence, starting from the lowest address in the data storage module and ending with the highest addresses in the data storage module. However, it will be understood that alternative implementations are possible in which the addresses in the data storage module are processed in a different order. For example, in some implementations, at step 970, the next address that is to be processed may be selected at random. As another example, at step 970, the next address that is to be processed may be selected in accordance with a predetermined algorithm for the selection of addresses in the data storage module. Stated succinctly, the example of FIG. 9 is not limited to any specific sequence for processing the addresses in the data storage module.

Figure 10:
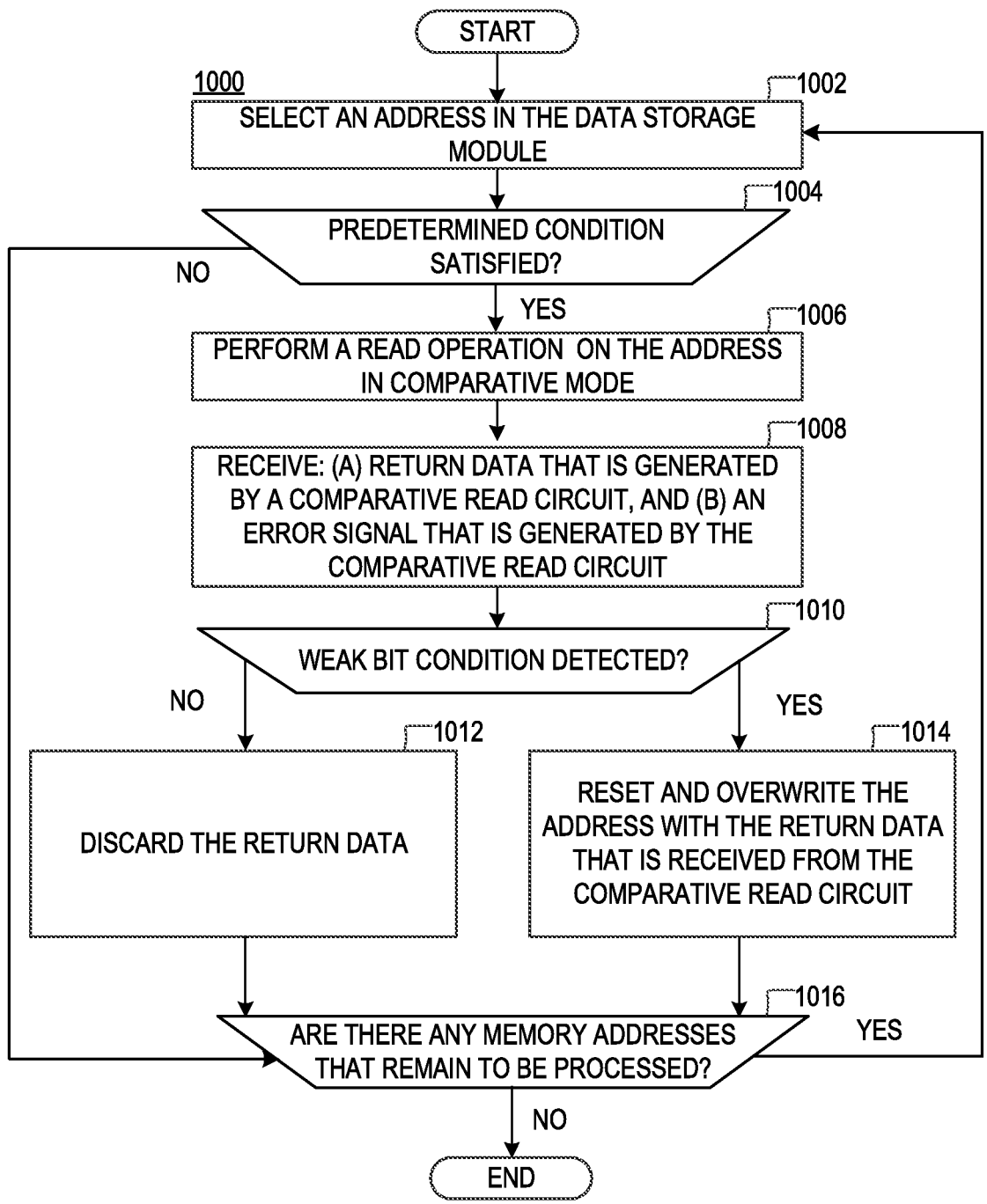
FIG. 10 is a flowchart of an example of a process, according to aspects of the disclosure.
Figure 1:
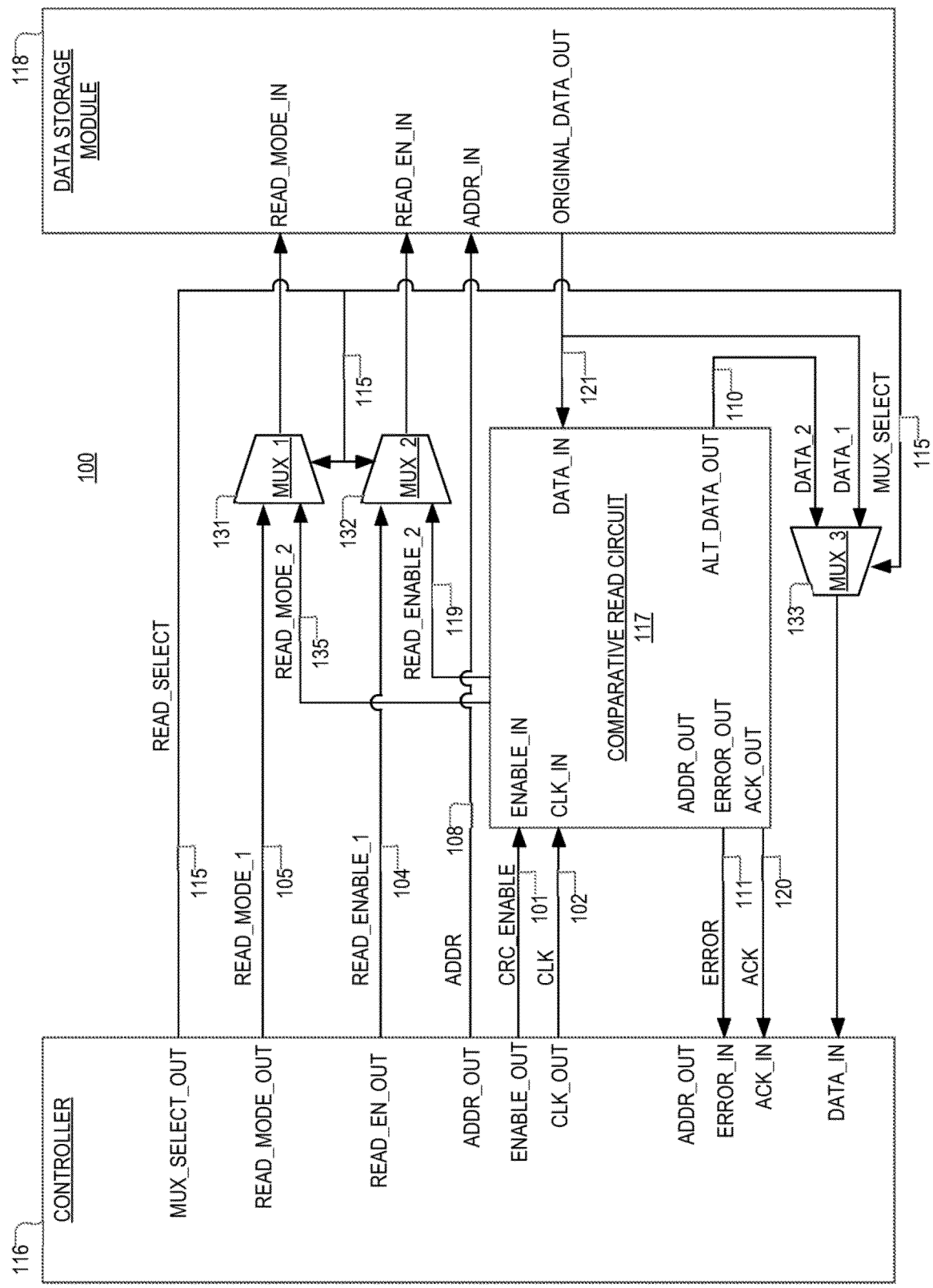

FIG. 10 is a flowchart of an example of a process 1000 for performing weak-bit correction on an EEPROM data storage module. In some implementations, the process 1000 may be performed by a controller of an EEPROM data storage module, such as the controller 116. However, it will be understood that the present disclosure is not limited to any specific implementation of the process 1000.

At step 1002, an address in the data storage module is selected. In some implementations, the data storage module may be the same or similar to the data storage module 118, which is discussed above with respect to FIGS. 1-3.

At step 1004, a determination is made if a condition is satisfied. In some implementations, the condition may be satisfied when: (i) a temperature of the data storage module exceeds a first threshold, and (ii) a count of write operations (e.g., erase/program operations) that are performed at the address during a given time period exceeds a second threshold. Additionally or alternatively, in some implementations, the conditions may be satisfied when a count of write operations performed at the address during a given time period exceeds a threshold, irrespective of the temperature of the memory module. Additionally or alternatively, in some implementations, the conditions may be satisfied when a count of write operations that are performed at the address during a given time period exceeds a threshold that is based on the temperature of the memory module. In such implementations, the threshold may have a first value when the memory module has a first temperature, and a second value when the memory module has a second temperature. To determine the value of the temperature-based threshold, the controller may use a table that relates different threshold values to corresponding temperature values. If the condition is satisfied, the process 1000 proceeds to step 1006. Otherwise, if the predetermined condition is not satisfied, the process 1000 proceeds to step 1016.

At step 1006, a read operation is performed on the selected address in a comparative mode. In some implementations, the read operation may be performed by using a comparative read circuit, such as the comparative read circuit 117, which is discussed above with respect to FIGS. 1-3. Additionally or alternatively, in some implementations, the read operation may be performed, in a comparative mode, as discussed above with respect to FIGS. 1-3.

At step 1008, the controller receives an error signal and return data that are generated by the comparative read circuit as a result of executing the read operation in comparative mode. In some implementations, the error signal may be the same or similar to the error signal 111, which is discussed above with respect to FIGS. 1-3, and it may indicate whether a weak bit condition is present at the address (selected at step 1012). Additionally or alternatively, in some implementations, the return data may be the same or similar to the return data, which is discussed above with respect to FIGS. 1-3, At step 1010, the controller determines whether one or more weak bit conditions have been detected by the comparative read circuit. The determination may be performed by examining the value of the error signal (received at step 1008). If the error signal is set to a first value (e.g., a logic high value), the controller may determine that at least one weak-bit condition has been detected by the comparative read circuit, and the process 1000 proceeds to step 1014. Otherwise, if the error signal is set to a second value (e.g., a logic low value), the controller may determine that no weak bit conditions have been detected by the comparative read circuit, and the process 1000 proceeds to step 1012.

At step 1012, the return data (received at step 1008) is discarded. At step 1014, the controller 116 resets the address and writes the return data (received at step 1008) back to the address (selected at step 1002). As discussed above, overwriting the address in this manner may have the effect of removing any weak bit conditions that are present at the address.

At step 1016, a determination is made if there are any memory addresses that remain to be processed. If there are one or more other memory addresses that remain to be processed, the process 1000 returns to step 1002, and steps 1002-10014 are repeated for another address in the memory module, which has not been processed yet. If there are no other memory addresses that remain to be processed, the process 1000 ends.

As noted above, in some implementations, the process 1000 may be performed in response to executing write operation(s) on one or more of the addresses in the memory module in order to ensure that the execution of the write operation(s) would not give rise to weak bit conditions in the memory module. In some implementations, in a single run of the process 1000, steps 1002-1014 may be executed for each address in the memory module, except for the address(es) that are written to. Additionally or alternatively, in some implementations, in a single run of the process 1000, steps 1002-1014 may be executed once for each address in the memory module.

FIGS. 1-10 are provided as an example only. At least some the steps described in these figures can be performed in parallel, in a different order, or altogether. Although the examples discussed with respect to FIGS. 1-10 describe that certain actions are performed by setting signals to a logic high value, it will be understood that alternative implementations are possible in which the same actions are driven by setting the signals to a logic low value. Although the examples discussed with respect to FIGS. 1-10 describe that certain actions are performed by setting signals to a logic low value, it will be understood that alternative implementations are possible in which the same actions are driven by setting the signals to a logic high value. Stated succinctly, the present disclosure is not limited to any specific implementation of the signaling within the memory device 100. Although some of the preocess(es) described throughout the disclosure are executed concurrently with the servicing of read requests, alternative implementations are possible in which the precess(es) are executed independently of the servicing of any read requests.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims<EDD>.

The invention claimed is:

1. A method for use in a memory device having a data storage module and a controller that is operatively coupled to the data storage module, the method comprising:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address,
wherein the detecting of whether a weak bit condition is present at the address of the data storage module is performed in response to a request to write data at another address in the data storage module, and correcting the weak bit condition includes overwriting the address with the data that is stored in the second register.

2. The method of claim 1, wherein detecting whether a weak bit condition is present at the address includes comparing the data stored in the first register to the data stored in the second register, determining that a weak bit condition is not present at the address when the data stored in the first register matches the data stored in the second register, and determining that a weak bit condition is present at the address when the data stored in the first register does not match the data stored in the second register.

3. A method for use in a memory device having a data storage module and a controller that is operatively coupled to the data storage module, the method comprising:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address,
wherein correcting the weak bit condition includes generating corrected data based on the data stored in the first register and the data stored in the second register and overwriting the address with the corrected data, and
wherein the memory device further includes a comparative read circuit that is interposed between the controller and the data storage module, the comparative read circuit including the first register and the second register, the first read and the second read are performed by the comparative read circuit, the corrected data is generated by the comparative read circuit, and overwriting the address with the corrected data includes providing, by the comparative read circuit, the corrected data to the controller along with a signal, which when received by the controller, causes the controller to reset the address and write the corrected data to the address.

4. A method for use in a memory device having a data storage module and a controller that is operatively coupled to the data storage module, the method comprising:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address, wherein detecting whether the weak bit condition is present at the address is performed only when the temperature is above a threshold.

5. A method for use in a memory device having a data storage module and a controller that is operatively coupled to the data storage module, the method comprising:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address, wherein detecting whether the weak bit condition is present at the address is performed only when the count of write operations that are performed at the address is above a threshold.

6. A method for use in a memory device having a data storage module and a controller that is operatively coupled to the data storage module, the method comprising:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address
wherein the data storage module includes an Electrically Erasable Programmable Read-Only Memory (EEPROM) matrix, the second read voltage is higher than the first read voltage, and generating the corrected data includes one of executing a bitwise OR operation based on the data that is stored in the first register and the second register, and (iii) executing a bitwise AND operation based on the data that is stored in the first register and the second register.

7. A system comprising:
a data storage module; and
a processing circuitry operatively coupled to the data storage module, wherein the processing circuitry is configured to perform the operations of:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address,
wherein the detecting of whether a weak bit condition is present at the address of the data storage module is performed in response to a request to write data at another address in the data storage module, and correcting the weak bit condition includes overwriting the address with the data that is stored in the second register.

8. The system of claim 7, wherein detecting whether the weak bit condition is present at the address is performed only when the temperature is above a threshold.

9. The system of claim 7, wherein detecting whether the weak bit condition is present at the address is performed only when the count of write operations that are performed at the address is above a threshold.

10. The system of claim 7, wherein detecting whether a weak bit condition is present at the address includes comparing the data stored in the first register to the data stored in the second register, determining that a weak bit condition is not present at the address when the data stored in the first register matches the data stored in the second register, and determining that a weak bit condition is present at the address when the data stored in the first register does not match the data stored in the second register.

11. A system comprising:
a data storage module; and
a processing circuitry operatively coupled to the data storage module, wherein the processing circuitry is configured to perform the operations of:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address,
wherein correcting the weak bit condition includes generating corrected data based on the data stored in the first register and the data stored in the second register and overwriting the address with the corrected data, and
wherein the processing circuitry includes a controller and a comparative read circuit, the comparative read circuit being interposed between the controller and the data storage module, the comparative read circuit including the first register and the second register, the first read and the second read are performed by the comparative read circuit, the corrected data is generated by the comparative read circuit, and overwriting the address with the corrected data includes providing, by the comparative read circuit, the corrected data to the controller along with a signal, which when received by the controller, causes the controller to reset the address and write the corrected data to the address.

12. The system of claim 11, wherein:
the data storage module includes an Electrically Erasable Programmable Read-Only Memory (EEPROM) matrix,
the second read voltage is higher than the first read voltage, and
generating the corrected data includes one of executing a bitwise OR operation based on the data that is stored in the first register and the second register, and (iii) executing a bitwise AND operation based on the data that is stored in the first register and the second register.

13. A sensor comprising:
a sensor controller;
one or more sensing elements operatively coupled to the sensor controller; and
a memory operatively coupled to the controller, the memory including a data storage module and a processing circuitry operatively coupled to the data storage module, the processing circuitry being configured to perform the operations of:
performing a first read from an address in the data storage module by using a first read voltage;
storing, in a first register, data that is retrieved from the data storage module as a result of the first read;
performing a second read from the address by using a second different read voltage;
storing, in a second register, data that is retrieved from the data storage module as a result of the second read;
detecting whether a weak bit condition is present at the address based on the data that is stored in the first register and the data that is stored in the second register; and
correcting the weak bit condition when the weak bit condition is present at the address.

14. The sensor of claim 13, wherein correcting the weak bit condition includes overwriting the address with the data that is stored in the second register.

15. The sensor of claim 13, wherein:
the detecting of whether a weak bit condition is present at the address of the data storage module is performed in response to a request to write data at another address in the data storage module, and
correcting the weak bit condition includes generating corrected data based on the data stored in the first register and the data stored in the second register.

16. The sensor of claim 15, wherein the processing circuitry is further configured to perform the operation of overwriting the address with the corrected data.

17. The sensor of claim 15, wherein:
the processing circuitry includes a controller and a comparative read circuit, the comparative read circuit being interposed between the controller and the data storage module, the comparative read circuit including the first register and the second register, the first read and the second read are performed by the comparative read circuit, the corrected data is generated by the comparative read circuit; and overwriting the address with the corrected data includes providing, by the comparative read circuit, the corrected data to the controller along with a signal, which when received by the controller, causes the controller to reset the address and write the corrected data to the address.

18. The sensor of claim 13, wherein detecting whether the weak bit condition is present at the address is performed only when the temperature is above a threshold.

19. The sensor of claim 13, wherein detecting whether the weak bit condition is present at the address is performed only when the count of write operations that are performed at the address is above a threshold.

20. The sensor of claim 15, wherein:
the data storage module includes an Electrically Erasable Programmable Read-Only Memory (EEPROM) matrix, the second read voltage is higher than the first read voltage, and generating the corrected data includes one of executing a bitwise OR operation based on the data that is stored in the first register and the second register, and (iii) executing a bitwise AND operation based on the data that is stored in the first register and the second register.

21. The sensor of claim 15, wherein detecting whether a weak bit condition is present at the address includes comparing the data stored in the first register to the data stored in the second register, determining that a weak bit condition is not present at the address when the data stored in the first register matches the data stored in the second register, and determining that a weak bit condition is present at the address when the data stored in the first register does not match the data stored in the second register.

22. A non-transitory computer-readable medium storing one or more processor executable instructions, which when executed by at least one processor cause the processor to perform the operations of:

performing a first read from an address in a data storage module by using a first read voltage;

storing, in a first register, data that is retrieved as a result of the first read;

performing a second read from the address by using a second read voltage;

storing, in a second register, data that is retrieved as a result of the second read;

detecting whether the data that is stored in the first register matches the data that is stored in the second register; and overwriting the address with the data stored in the second register, the address being overwritten in response to the data stored in the first register not matching the data stored in the second register.

23. The non-transitory computer-readable medium of claim 22, wherein the processor executable instructions, when executed by the at least one processor, further cause the at least one processor to generating corrected data based on the data that is stored in the first register and the data that is stored in the second register.

24. The non-transitory computer-readable medium of claim 22, wherein detecting whether a weak bit condition is present at the address includes comparing the data stored in the first register to the data stored in the second register, determining that a weak bit condition is not present at the address when the data stored in the first register matches the data stored in the second register, and determining that a weak bit condition is present at the address when the data stored in the first register does not match the data stored in the second register.

* * * * *

UNITED STATES PATENT AND TRADEMARK OFFICE
CERTIFICATE OF CORRECTION

PATENT NO. : 11,327,882 B2  
APPLICATION NO. : 16/782139  
DATED : May 10, 2022  
INVENTOR(S) : Muhammed Sarwar et al.

It is certified that error appears in the above-identified patent and that said Letters Patent is hereby corrected as shown below:

On the Title Page

Replace the illustrative print figure, Fig. 1, as shown on the attached drawing sheet showing the corrected Fig. 1.

In the Drawings

Please replace Figs. 1, 7, 9 with Figs. 1, 7, 9 as shown on the attached drawing sheets.

In the Specification

Column 1, Line 7 delete "can stored" and replace with --can store--.

Column 1, Line 12 delete "use" and replace with --and use--.

Column 2, Line 65 delete "occurrence weak" and replace with --occurrence of weak--.

Column 3, Line 20 delete "name" and replace with --names--.

Column 3, Line 21 delete "voltage." or" and replace with --voltage") or--.

Column 4, Lines 29-30 delete "circuit may" and replace with --circuit 117 may--.

Column 4, Line 43 delete "signal 111 first" and replace with --signal 111 to a first--.

Column 5, Line 8 delete "name" and replace with --names--.

Column 5, Line 9 delete "voltage" or" and replace with --voltage") or--.

Column 5, Line 46 delete "circuit." and replace with --circuit 117.--.

Signed and Sealed this  
Twenty-ninth Day of July, 2025

Coke Morgan Stewart  
*Acting Director of the United States Patent and Trademark Office*

Column 5, Line 48 delete "circuit or" and replace with --circuit 117 or--.

Column 5, Line 51 delete "data 121" and replace with --data signal 121--.

Column 5, Line 54 delete "to a logic" and replace with --to logic--.

Column 6, Line 41 delete "controller 118" and replace with --controller 116--.

Column 6, Line 44 delete "circuit 117" and replace with --circuit 100--.

Column 7, Line 5 delete "module." and replace with --module 118.--.

Column 9, Line 11 delete "circuit, and" and replace with --circuit 117, and--.

Column 9, Line 59 delete "circuit outputs" and replace with --circuit 117 outputs--.

Column 9, Lines 63-64 delete "circuit outputs" and replace with --circuit 117 outputs--.

Column 10, Line 1 delete "have" and replace with --has--.

Column 10, Line 43 delete "the 135" and replace with --the signal 135--.

Column 11, Line 42 delete "includes setting to a" and replace with --to a--.

Column 12, Line 2 delete "in used" and replace with --used in--.

Column 12, Line 30 delete "that that is" and replace with --that is--.

Column 12, Lines 49-50 delete "associated the" and replace with --associated with the--.

Column 12, Line 66 delete "has been" and replace with --have been--.

Column 13, Line 23 delete "addresses" and replace with --address--.

Column 14, Line 44 delete "1002-10014" and replace with --1002-1014--.

Column 15, Line 8 delete "preocess(es)" and replace with --process(es)--.

Column 15, Line 11 delete "precess(es)" and replace with --process(es)--.

Column 15, Line 23 delete "solved." and replace with --sold--.

Column 16, Line 67 delete "claims <EED>." and replace with --claims--.

Column 18, Line 67 delete ", and (iii) executing" and replace with --, and executing--.

Column 20, Lines 25-26 delete ", and (iii) executing" and replace with --, and executing--.

Column 21, Lines 29-30 delete ", and (iii) executing" and replace with --, and executing--.